United States Patent
Endres (10) Patent No.: US 12,046,263 B2
(45) Date of Patent: Jul. 23, 2024

(54) OFFSET CORRECTION IN A VOLTAGE CONTROLLED MAGNETORESISTIVE SENSOR

(71) Applicant: Infineon Technologies AG, Neubiberg (DE)

(72) Inventor: Bernhard Endres, Nabburg (DE)

(73) Assignee: Infineon Technologies AG, Neubiberg (DE)

(*) Notice: Subject to any disclaimer, the term of this patent is extended or adjusted under 35 U.S.C. 154(b) by 14 days.

(21) Appl. No.: 17/935,743

(22) Filed: Sep. 27, 2022

(65) Prior Publication Data

US 2024/0103102 A1 Mar. 28, 2024

(51) Int. Cl.
*G11B 5/39* (2006.01)
*G01R 33/00* (2006.01)
*G01R 33/09* (2006.01)

(52) U.S. Cl.
CPC ........ *G11B 5/3909* (2013.01); *G01R 33/0035* (2013.01); *G01R 33/098* (2013.01); *G11B 5/3945* (2013.01); *G11B 2005/3996* (2013.01)

(58) Field of Classification Search
None
See application file for complete search history.

(56) References Cited

U.S. PATENT DOCUMENTS

| 2006/0290545 A1* | 12/2006 | Granig et al. | G01D 5/2448 341/118 |
| 2018/0090674 A1 | 3/2018 | Wang et al. | |
| 2018/0172481 A1* | 6/2018 | Mochizuki | G01D 5/145 |
| 2020/0378798 A1* | 12/2020 | Koeck et al. | G01D 5/145 |

FOREIGN PATENT DOCUMENTS

| WO | 2014025914 A1 | 2/2014 |
| WO | 2019040408 A1 | 2/2019 |

OTHER PUBLICATIONS

P. Wisniowski et al., "Reduction of Low Frequency Magnetic Noise by Voltage-Induced Magnetic Anisotropy Modulation in Tunneling Magnetoresistance Sensors," Applied Physics Letters 105, 082404 (2014): AIP Publishing LLC: http://dx.doi.org/10.1063/1.4894172, Aug. 27, 2014, 6 pages.
A. Koziol-Rachwal et al., "Enhancement of Perpendicular Magnetic Anisotropy and Its Electric Field-Induced Change Through Interface Engineering in Cr/Fe/MgO," Scientific Reports: www.nature.com/scientificreports, Jul. 20, 2017, 11 pages.
Z. Wen et al., "Voltage Control of Magnetic Anisotropy in Epitaxial Ru/Co2FeAl/MgO Heterostructures," Scientific Reports: www.nature.com/scientificreports, Mar. 23, 2017, 8 pages.

* cited by examiner

*Primary Examiner* — Craig A. Renner
(74) *Attorney, Agent, or Firm* — Harrity & Harrity, LLP (57) ABSTRACT

In some implementations, a magnetic sensor may apply an electrical signal across a tunnel barrier layer of a tunnel magnetoresistive (TMR) sensing element. The electrical signal may have a first signal level during a first time period and a second signal level during a second time period. The second signal level may be different from the first signal level. The magnetic sensor may generate an offset-corrected sensor signal based on a sensor signal that results from applying the electrical signal across the tunnel barrier layer of the TMR sensing element.

20 Claims, 8 Drawing Sheets

OFFSET CORRECTION IN A VOLTAGE CONTROLLED MAGNETORESISTIVE SENSOR

BACKGROUND

A magnetic tunnel junction (MTJ) includes a free layer and a reference layer, with the free layer and the reference layer being separated by an interlayer layer to form a magnetic tunnel junction. A direction of magnetization of the reference layer is stable such that the direction of magnetization is substantially fixed, whereas a direction of magnetization of the free layer is not fixed and can be influenced by an external magnetic field. Deviations in the magnetization of the free layer result in changes in resistance through the magnetic tunnel junction, a characteristic which can be sensed in order to, in the example of a magnetic field sensor, detect and quantify an externally applied magnetic field. This phenomenon is referred to as the tunneling magnetoresistance (TMR) effect.

SUMMARY

In some implementations, a method includes applying, by a circuit component of a magnetic sensor, an electrical signal across a tunnel barrier layer of a tunnel magnetoresistive (TMR) sensing element, the electrical signal having: a first signal level during a first time period, and a second signal level during a second time period, the second signal level being different from the first signal level; and generating, by the circuit component of the magnetic sensor, an offset-corrected sensor signal based on a sensor signal that results from applying the electrical signal across the tunnel barrier layer of the TMR sensing element.

In some implementations, a magnetic sensor includes a TMR sensing element, and a circuit component configured to: apply an electrical signal across a tunnel barrier layer of the TMR sensing element, the electrical signal having a first signal level during a first set of time periods, and a second signal level during a second set of time periods, the second signal level being different from the first signal level; obtain a sensor signal resulting from applying the electrical signal across the tunnel barrier layer; and generate an offset-corrected sensor signal based on the sensor signal that results from applying the electrical signal across the tunnel barrier layer of the TMR sensing element.

In some implementations, a sensor includes a magnetoresistive (MR) sensing element, and one or more components configured to: apply an electrical signal across a tunnel barrier layer of the MR sensing element during a first time period, the electrical signal having a first signal level during the first time period; apply the electrical signal across the tunnel barrier layer of the MR sensing element during a second time period, the electrical signal having a second signal level during the second time period, wherein the second signal level is different from the first signal level; and generate an offset-corrected sensor signal based on a sensor signal that results from applying the electrical signal across the tunnel barrier layer of the MR sensing element during the first time period and the second time period.

DETAILED DESCRIPTION

The following detailed description of example implementations refers to the accompanying drawings. The same reference numbers in different drawings may identify the same or similar elements.

Figure 1:
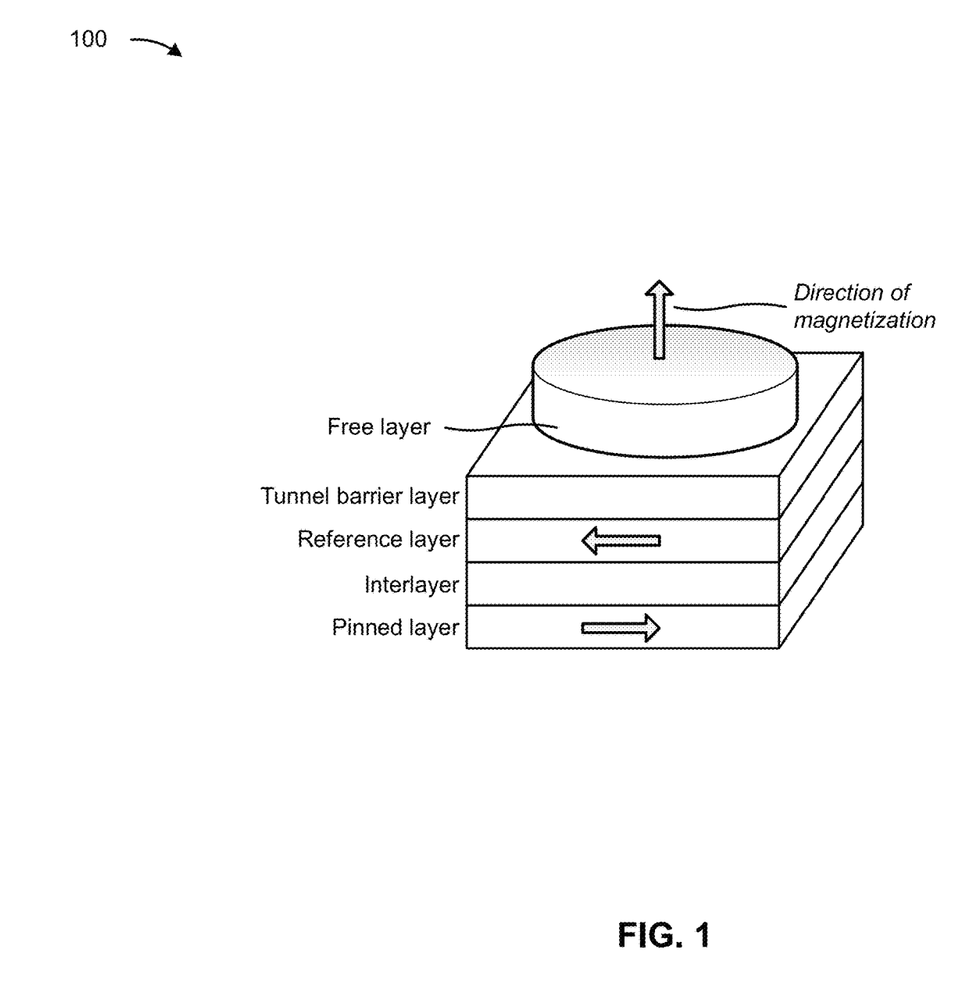
FIG. 1 is a diagram illustrating a TMR sensing element with a free layer having perpendicular magnetic anisotropy (PMA).

A free layer of a sensing element, such as a TMR sensing element, may have a perpendicular magnetic anisotropy (PMA). PMA is a magnetic anisotropy in which the direction of the easy axis is perpendicular to a surface of the free layer and the direction of the hard axis is parallel to the surface of the free layer (i.e., in-plane). FIG. 1 is a diagram illustrating a TMR sensing element 100 with a free layer having PMA.

In a TMR sensing element, PMA can stem from an interface between a cobalt iron boron (CoFeB) free layer and a magnesium oxide (MgO) tunnel barrier layer. Applying a voltage across the MgO tunnel barrier layer changes occupied states at the interface between the CoFeB free layer and the MgO tunnel barrier layer which, in turn, affects PMA of the sensing element. Therefore, the PMA of the TMR sensing element can be controlled via a voltage signal applied across the tunnel barrier layer. It follows that PMA of the TMR sensing element can be controlled by such a voltage signal so as to enable control of sensitivity and linear range of the TMR sensing element.

However, even when PMA control is provided for a TMR sensing element, the TMR sensing element can still have an offset in an output signal, which degrades accuracy and reliability of a magnetic sensor including the TMR sensing element. For example, the magnetic sensor may include a set of TMR sensing elements connected in a Wheatstone bridge configuration.

In one particular example, a magnetic sensor may include two TMR sensing elements (e.g., a TMR sensing element on a left side of a chip and a TMR sensing element on a right side of the chip) arranged in a Wheatstone bridge configuration to provide an output signal corresponding to a differential measurement of a magnetic field. An offset may be present in the output signal due to (1) a lithography procedure that results in an area (e.g., disc size) of an MgO tunnel barrier layer in one TMR sensing element being slightly different from an area of an MgO tunnel barrier layer in the other TMR sensing element, (2) an etching procedure that results in non-uniformity in thinning across the wafer, or (3) an MgO deposition procedure that results in non-homogenous MgO deposition across the wafer.

In another particular example, a magnetic sensor may include an MR sensing element having a local Wheatstone bridge configuration (i.e., a mono-cell), with magnetization of the MR sensing element being defined via a local magnetization process. Here, an offset may be present in an output signal due to (1) magnetization of the MR sensing element better aligning in one direction due to anisotropy of an antiferromagnetic layer of the MR sensing element, (2) impacts of demagnetization or degradation on a local alignment of a reference system of the MR sensing element, (3) process variations during the local magnetization process.

Some implementations described herein enable offset correction in voltage-controlled MR sensor. In some implementations, a circuit component of a magnetic sensor may apply an electrical signal across a tunnel barrier layer of an MR sensing element. Here, the electrical signal is applied so as to have a first signal level during a first time period and a second signal level during a second time period. The circuit component may generate an offset-corrected sensor signal based on a sensor signal that results from applying the electrical signal across the tunnel barrier layer of the MR sensing element. In this way, PMA control of the MR sensing element can be utilized to provide offset correction, thereby improving accuracy and reliability of the magnetic sensor. Additional details are provided below.

Figure 2A:
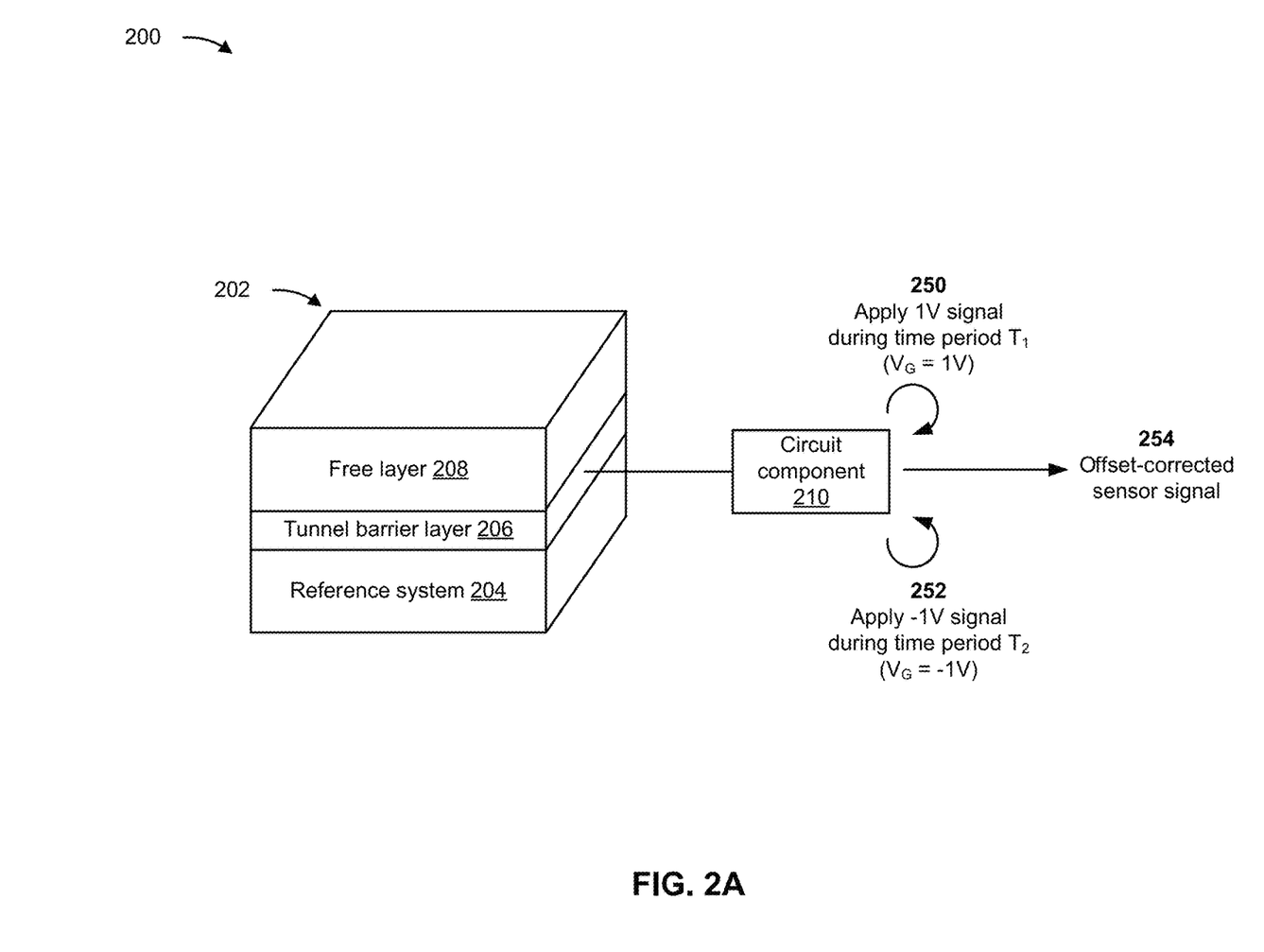
FIGS. 2A-2D are diagrams illustrating examples associated with offset correction in a voltage controlled magnetic sensor described herein.
Figure 2B:
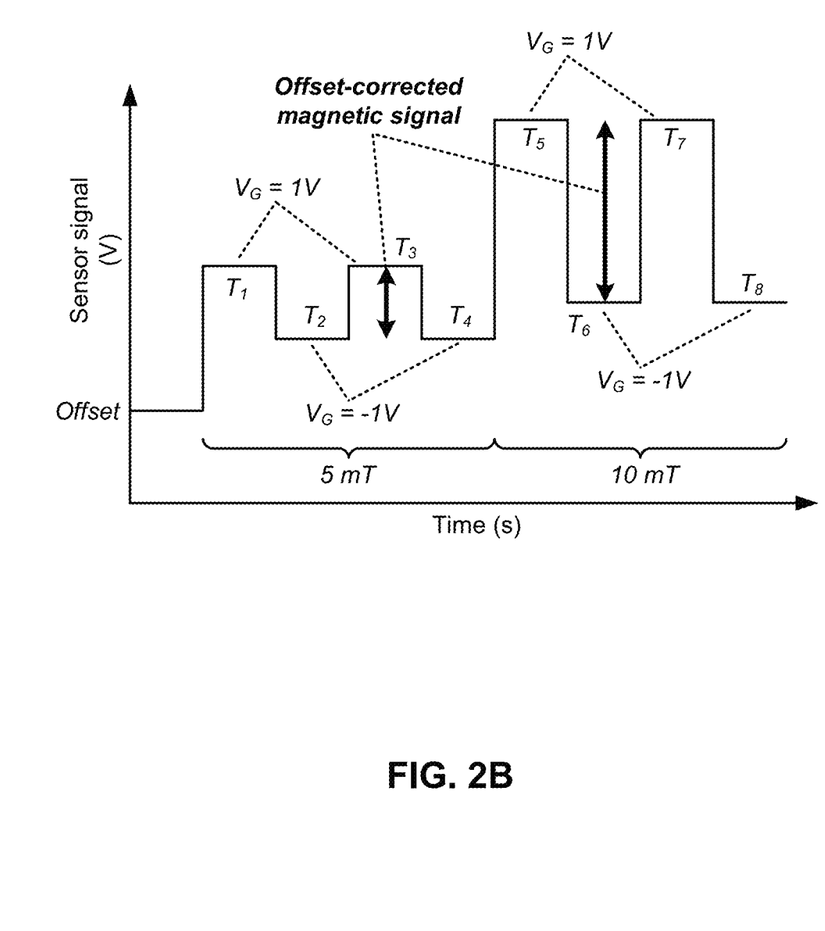
Figure 2C:
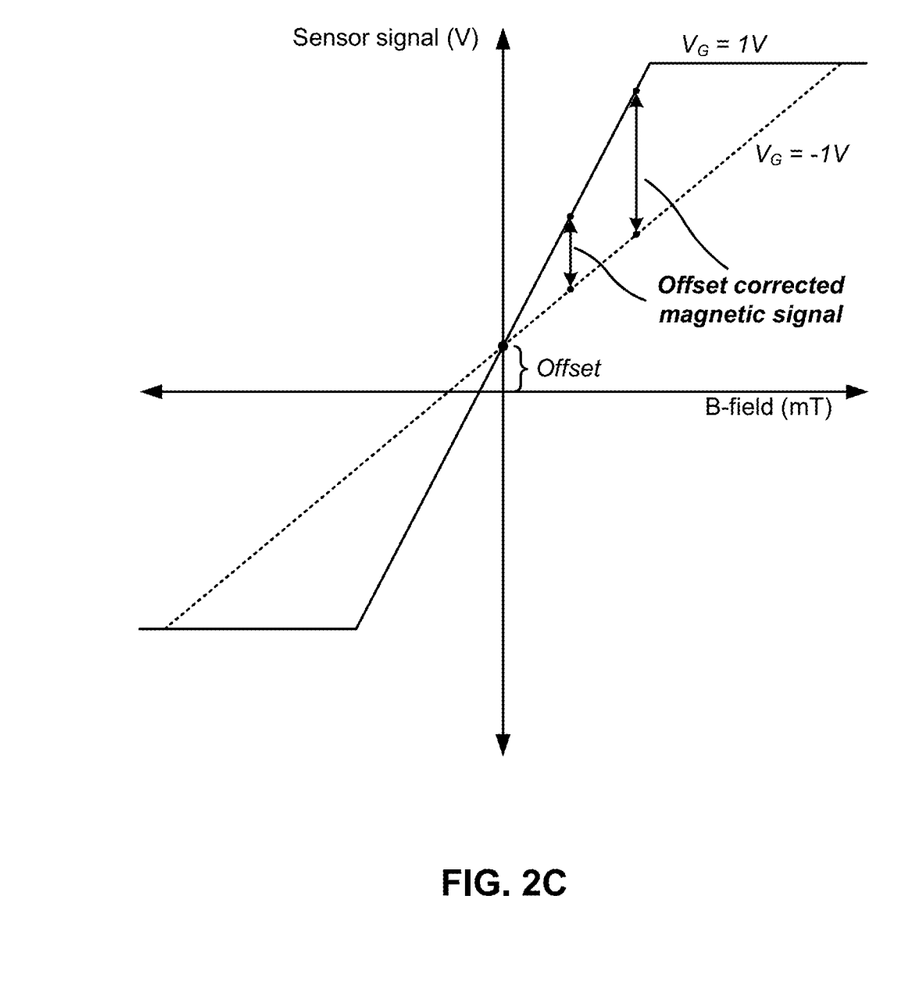
Figure 2D:
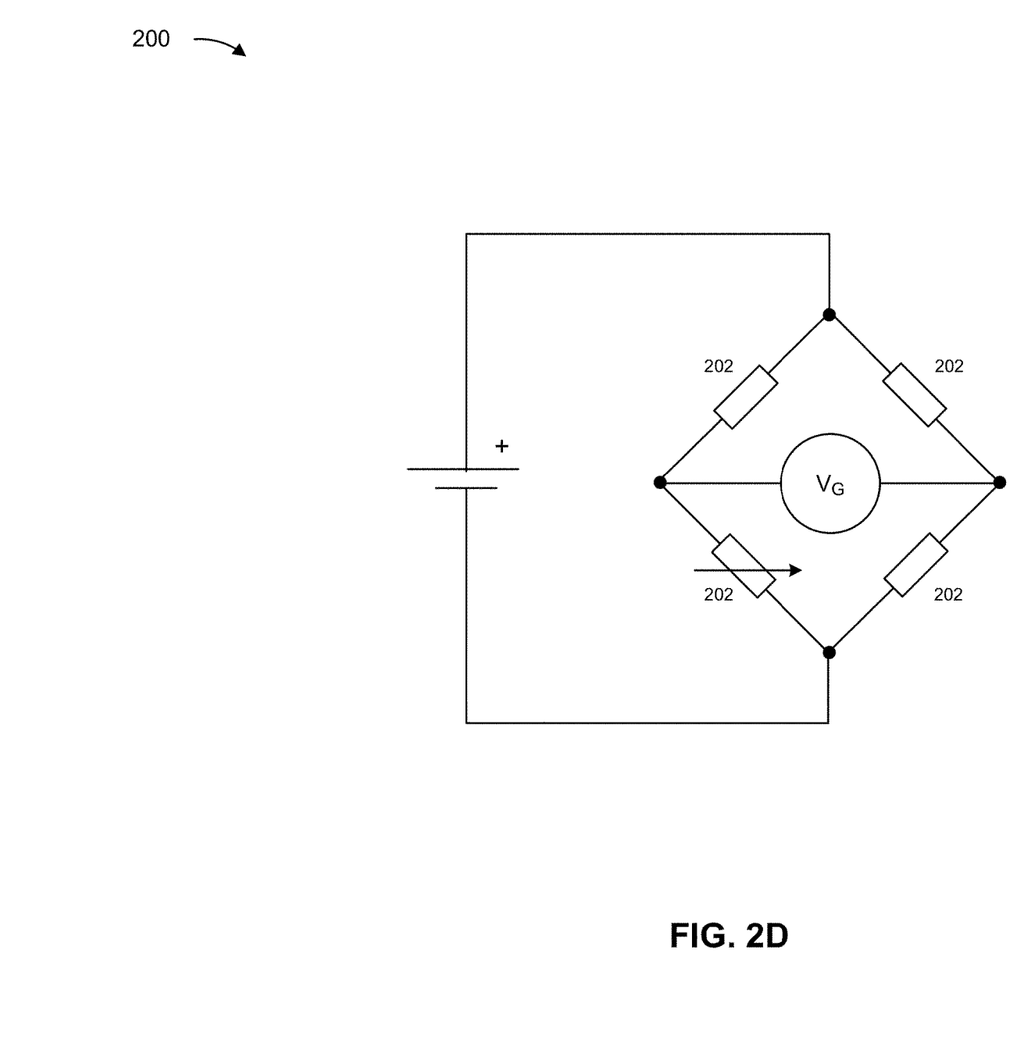

FIGS. 2A-2D are diagrams illustrating example implementations associated with offset correction in a voltage controlled magnetic sensor 200. As shown in FIG. 2A, the magnetic sensor 200 may include a sensing element 202 comprising a reference system 204, a tunnel barrier layer 206, and a free layer 208. As further shown, the magnetic sensor 200 may include a circuit component 210. In some implementations, the sensing element 202 is electrically connected to one or more other sensing elements 202 in a Wheatstone bridge configuration as illustrated in FIG. 2D. The reference system 204 is a structure designed to have a fixed direction of magnetization. The tunnel barrier layer 206 is a layer designed to permit electrons to tunnel between the reference system 204 and the free layer 208 when a bias voltage is applied to electrodes of the sensing element 202 (not shown) in order to provide the TMR effect. The free layer 208 is a structure for which a direction of magnetization changes (e.g., rotates) in response to an external magnetic field. Additional details regarding sensing element 202 are provided below with respect to FIGS. 4 and 5.

The circuit component 210 is a component capable of controlling PMA of the sensing element 202. For example, the circuit component 210 may include one or more components capable of applying an electrical signal (e.g., a voltage signal) across the tunnel barrier layer 206 such that the electrical signal has a first signal level during a first time period, and has a second signal level during a second time period. The circuit component 210 may be further capable of generating an offset-corrected sensor signal based on a sensor signal that results from applying the electrical signal across the tunnel barrier layers of one or more sensing elements 202. Example operation of the circuit component 210 is described below.

In an example of operation, the circuit component 210 may apply an electrical signal across the tunnel barrier layer 206 during a first time period. For example, as shown by reference 250 in FIG. 2A, the circuit component 210 may apply a voltage signal $V_G$ across the tunnel barrier layer 206 during a time period $T_1$, with the voltage signal $V_G$ having a signal level of 1 volt (V) during the time period $T_1$. In some implementations, the first signal level is a positive voltage level. For example, in some implementations, the first signal level is in a range from approximately 0.1 V to approximately 1 V.

The circuit component 210 may then apply the electrical signal across the tunnel barrier layer 206 during a second time period, with the signal level during the second time period being different from the signal level during the first time period. For example, as shown by reference 252, the circuit component 210 may apply the voltage signal $V_G$ across the tunnel barrier layer 206 during a time period $T_2$, with the voltage signal $V_G$ having a signal level of −1 V during the time period $T_2$. In some implementations, the second signal level is a negative voltage level. For example, in some implementations, the first signal level is in a range from approximately −0.1 V to approximately −1 V.

In some implementations, the circuit component 210 may alternate the electrical signal between the first signal level and the second signal level over a plurality of sequential time periods. FIG. 2B is a diagram illustrating an example of modulation of the electrical signal applied by the circuit component 210 to the tunnel barrier layer 206. As shown in FIG. 2B, the circuit component 210 may apply a 1 V voltage signal across the tunnel barrier layer 206 during the time period $T_1$, may apply a −1 V voltage signal across the tunnel barrier layer 206 during the time period $T_2$, may apply a 1 V voltage signal across the tunnel barrier layer 206 during a time period $T_3$, may apply a −1 V voltage signal across the tunnel barrier layer 206 during a time period $T_4$, and so on. In some implementations, modulation of the electrical signal in this manner enables offset correction, as described below.

In some implementations, the PMA of the sensing element 202 while the electrical signal is at the first signal level differs from the PMA of the sensing element 202 while the electrical signal is at the second signal level. Thus, the PMA, and therefore the sensitivity or the linear range, of the sensing element 202 during the first time period may differ from the PMA during the second time period.

FIG. 2C is a diagram of an example illustrating how the sensitivity and linear range of the sensing element 202 differ based on the level of the electrical signal at the tunnel barrier layer 206 by the circuit component 210. The solid line in FIG. 2C corresponds to a sensor signal when the electrical signal has a first signal level (e.g., $V_G$=1 V) over a magnetic field (B-field) range, while the dotted line in FIG. 2C corresponds to performance of the sensing element 202 when the electrical signal has a second signal level (e.g., $V_G$=−1 V) over the magnetic field range. As illustrated in FIG. 2C by comparing slopes of the solid and dotted lines, the sensitivity of the sensing element 202 is increased when the electrical signal is at the first signal level. As illustrated in FIG. 2C by comparing the linear ranges of the solid and dashed lines (i.e., B-field ranges in which the slopes are non-zero), the linear range of the sensing element 202 is increased when the electrical signal is at the second signal level. In some aspects, the modulation of the electrical signal may cause the PMA of the sensing element 202 during the first time period to differ from the PMA during the second time period by at least approximately 5%. In some implementations, the control of the PMA of the sensing element 202 (and the resulting change in sensitivity or linear range) enables generation of an offset-corrected sensor signal, as described below.

Returning to FIG. 2A, as shown by reference 254, the circuit component 210 may generate an offset-corrected sensor signal based on a sensor signal that results from applying the electrical signal across the tunnel barrier layer 206 during a plurality of time periods (e.g., the first time period $T_1$ and the second time period $T_2$). In some implementations, the circuit component 210 may obtain a sensor signal resulting from applying the electrical signal across the tunnel barrier layer 206 during the first time period $T_1$ and the second time period $T_2$, and may generate the offset-corrected sensor signal based on the sensor signal. For example, with reference to and as indicated in FIG. 2B, a constant offset may be present in the sensor signal (e.g., due to an imperfect fabrication procedure, as described above). However, as shown, for a given magnetic field strength (e.g., 5 milliteslas (mT), 10 mT, or the like) the signal level of the sensor signal when the electrical signal is at the first level (e.g., during time period $T_1$) is different from the signal level of the sensor signal when the electrical signal is at the second level (e.g., during the time period $T_2$), due to variance in PMA of the sensing element 202 among the different time periods. Here, the difference between the sensor signal level during time period $T_1$ and the sensor signal level during time period $T_2$ represents an offset-corrected sensor signal. That is, the offset of the sensing element 202 is corrected (i.e., is not present) in a signal that corresponds to a difference between the sensor signal level during the time period $T_1$ and the sensor signal level during the time period $T_2$. Therefore, in some implementations, the circuit component 210 generates the offset-corrected sensor signal by determining a difference between a signal level of the sensor signal during the first time period and a signal level of the sensor signal during the second time period.

In some implementations, the circuit component 210 generates the offset-corrected sensor signal for one or more pairs of adjacent time periods. For example, the circuit component 210 may generate a first output for the offset-corrected sensor signal based on a difference in the sensor signal level during the time period $T_1$ and the time period $T_2$, may generate a second output for the offset-corrected sensor signal based on a difference in signal level during the time period $T_3$ and the time period $T_4$, may generate a third output for the offset-corrected sensor signal based on a difference in signal level during the time period $T_5$ and the time period $T_6$, and so on. As another example, the circuit component 210 may generate a first output for the offset-corrected sensor signal based on a difference in an average of the sensor signal level during the time period $T_1$ and the time period $T_3$ and an average of the sensor signal level during the time period $T_2$ and the time period $T_4$, and may generate a second output for the offset-corrected sensor signal based on a difference in an average of the sensor signal level during the time period $T_5$ and the time period $T_7$ and an average of the sensor signal level during the time period $T_6$ and the time period $T_5$.

In some aspects, the offset-corrected sensor signal may correspond to a strength of an external magnetic field at the magnetic sensor 200. Alternatively, the offset-corrected sensor signal may in some implementations represent an amount of current creating a magnetic field at the magnetic sensor 200.

In this way, the magnetic sensor 200 (e.g., using the circuit component 210) may generate an offset-corrected sensor signal through controlling PMA of the sensing element 202, thereby improving accuracy and reliability of the magnetic sensor 200.

As indicated above, FIGS. 2A-2C are provided as examples. Other examples may differ from what is described with regard to FIGS. 2A-2C. The number, arrangement, thicknesses, and relative thicknesses, of layers and components shown in FIG. 2A are provided as an example. In practice, there may be additional layers or components, fewer layers or components, different layers or components, layers having different thicknesses, layers having different relative thicknesses, or differently arranged layers than those shown in FIG. 2A. Furthermore, two or more layers or components shown in FIG. 2A may be implemented within a single layer or components, or a single layer or components shown in FIG. 2A may be implemented as multiple, distributed layers or components. Additionally, or alternatively, a set of layers or components (e.g., one or more layers or one or more components) shown in FIG. 2A may perform one or more functions described as being performed by another set of layers or components shown in FIG. 2A.

Figure 3:
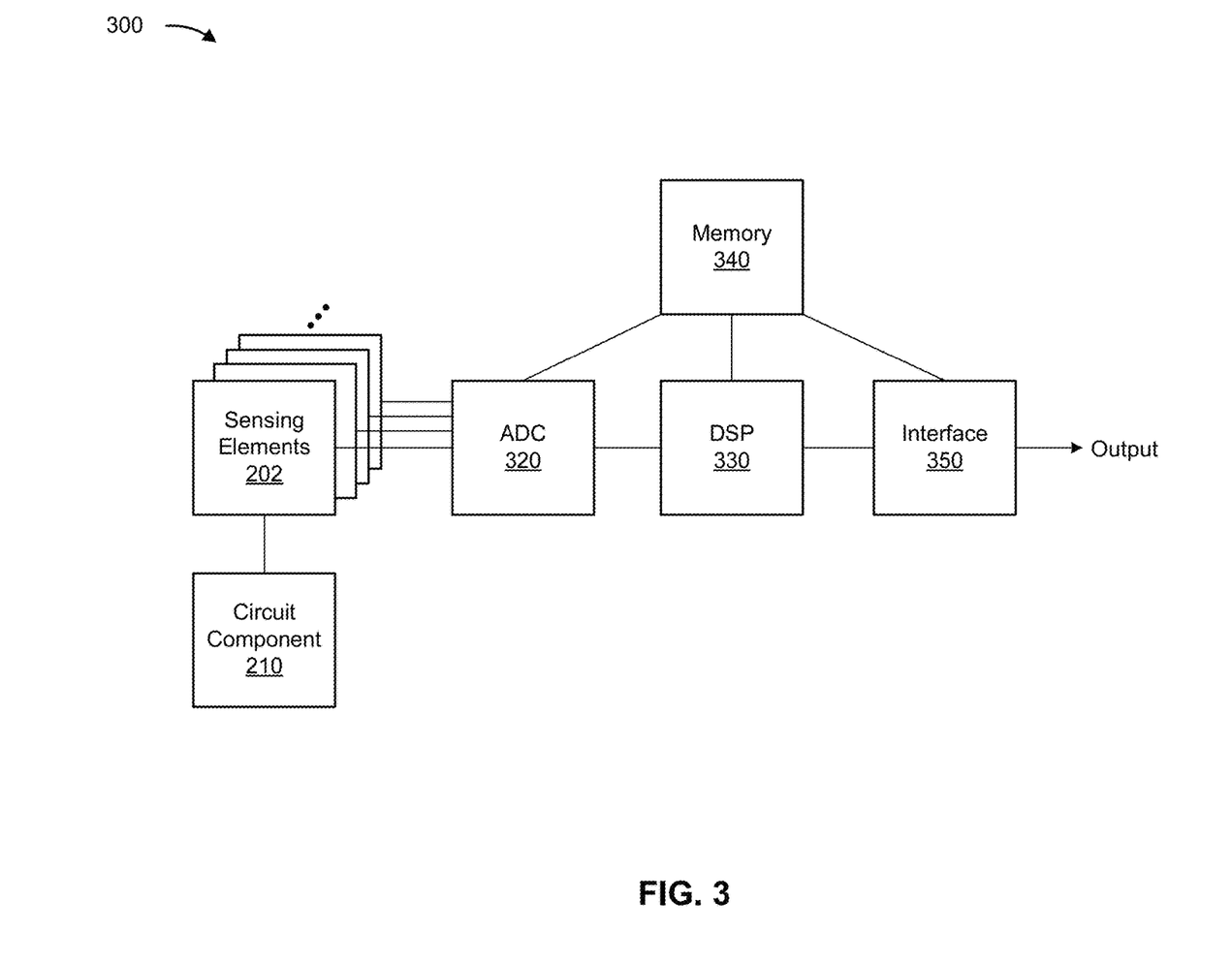
FIG. 3 is a diagram of example components of the magnetic sensor described herein.

FIG. 3 is a diagram of example components 300 of the magnetic sensor 200 described herein. As shown in FIG. 3, the magnetic sensor 200 may include a set of sensing elements 202, a circuit component 210, an analog-to-digital convertor (ADC) 320, a digital signal processor (DSP) 330, a memory component 340, and an interface 350.

Sensing element 202 may include a component for sensing a physical property (e.g., a magnetic field, a temperature, a pressure, or an acceleration, among other examples) in an environment of sensing element 202, and providing a signal corresponding to the sensed physical property. For example, sensing element 202 may include a component for sensing one or more components of a magnetic field present at the magnetic sensor 200 (e.g., a magnetic field generated by a magnet) and providing a signal corresponding to a strength of the sensed component of the magnetic field. In one particular example, sensing element 202 may include an MR-based sensing element, where the electrical resistance of the magnetoresistive material may depend on a strength and/or a direction of the magnetic field present at the magnetoresistive material. Here, sensing element 202 may operate based on an anisotropic magnetoresistance (AMR) effect, a giant magnetoresistance (GMR) effect, a tunnel magnetoresistance (TMR) effect, and/or the like. Notably, the above-described examples of sensing element 202 are provided for illustrative purposes and, in practice, sensing element 202 may include any type of component capable of sensing a physical property and providing a signal corresponding to the physical property.

Circuit component 210 may include one or more components capable of controlling PMA of one or more sensing elements 202 of the magnetic sensor 200, as described herein. For example, the circuit component 210 may include one or more components capable of applying an electrical signal across a tunnel barrier layer of one or more sensing elements 202, such that the electrical signal has a first signal level during a first time period, and has a second signal level during a second time period, as described herein. In some implementations, the circuit component 210 may generate an offset-corrected sensor signal based on a sensor signal that results from applying the electrical signal across the tunnel barrier layers of one or more sensing elements 202, as described herein.

ADC 320 may include an analog-to-digital converter that converts an analog signal from the set of sensing elements 202 to a digital signal. For example, ADC 320 may convert analog signals, received from the set of sensing elements 202, into digital signals to be processed by DSP 330. ADC 320 may provide the digital signals to DSP 330. In some implementations, magnetic sensor 200 may include one or more ADCs 320.

DSP 330 may include a digital signal processing device or a collection of digital signal processing devices. In some implementations, DSP 330 may receive digital signals from ADC 320 and may process the digital signals to form output signals (e.g., destined for a controller), such as an output signal that conveys sensor data, as described elsewhere herein.

Memory component 340 may include a read only memory (ROM) (e.g., an EEPROM), a random access memory (RAM), and/or another type of dynamic or static storage device (e.g., a flash memory, a magnetic memory, an optical memory, etc.) that stores information and/or instructions for use by magnetic sensor 200. In some implementations, memory component 340 may store information associated with processing performed by DSP 330. Additionally, or alternatively, memory component 340 may store configurational values or parameters for the set of sensing elements 202 and/or information for one or more other components of magnetic sensor 200, such as ADC 320 or interface 350.

Interface 350 may include an interface via which magnetic sensor 200 may receive and/or provide information from and/or to another device in a system, such as a controller. For example, interface 350 may provide the output signal, determined by DSP 330, to the controller and may further receive information from the controller.

The number and arrangement of components shown in FIG. 3 are provided as one or more examples. In practice, there may be additional components, fewer components, different components, or differently arranged components than those shown in FIG. 3. Furthermore, two or more components shown in FIG. 3 may be implemented within a single component, or a single component shown in FIG. 3 may be implemented as multiple, distributed components. Additionally, or alternatively, a set of components (e.g., one or more components) of magnetic sensor 200 may perform one or more functions described as being performed by another set of components of magnetic sensor 200.

Figure 4:
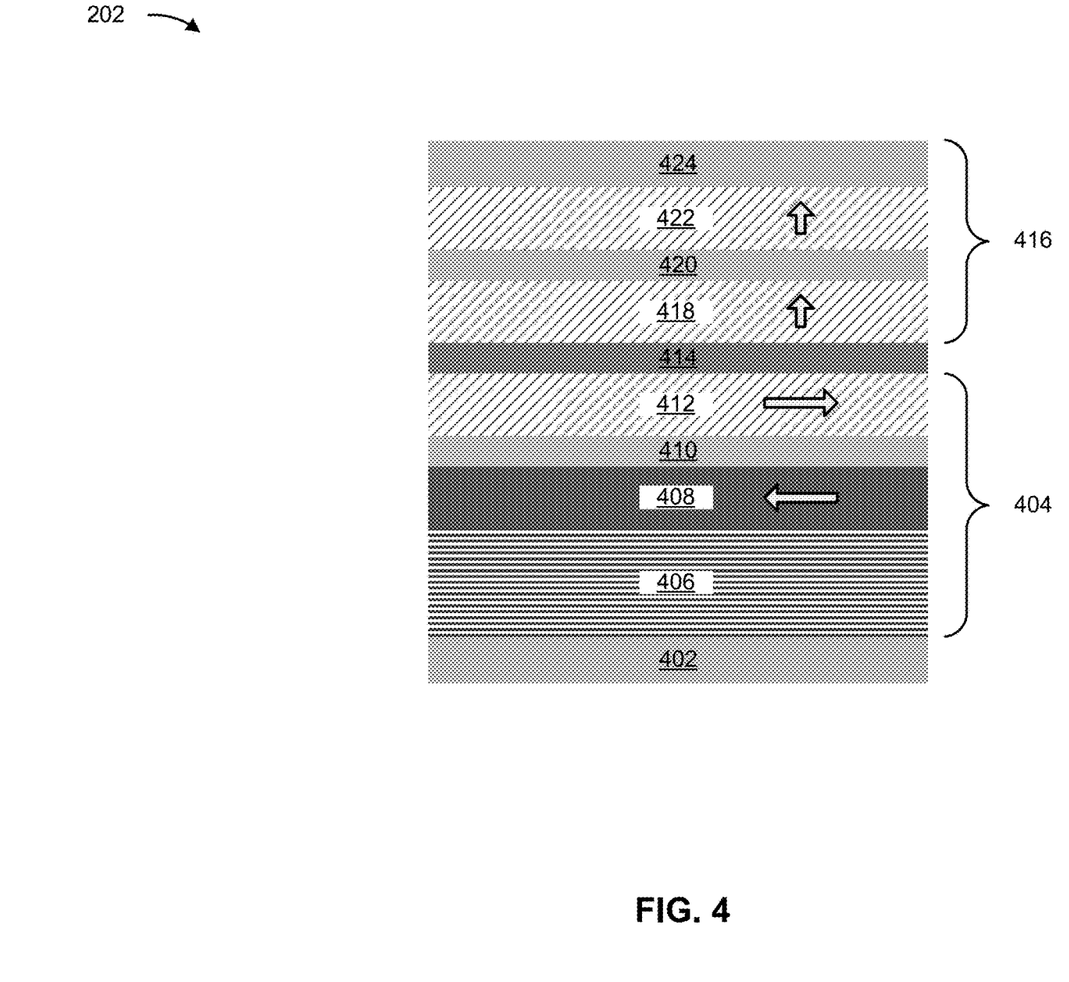
FIG. 4 is a diagram illustrating an example implementation of a sensing element included in a voltage controlled magnetic sensor described herein.

FIG. 4 is a diagram illustrating an example implementation of a sensing element 202 included in a voltage controlled magnetic sensor 200 described herein. As shown in FIG. 4, the sensing element 202 may in some implementations include a seed layer 402, a reference system 404 (corresponding to reference system 204), a tunnel barrier layer 414 (corresponding to tunnel barrier layer 206), a free layer 416 (corresponding to free layer 208), and a cap layer 424. As shown, the reference system 404 may include an antiferromagnetic layer 406, a pinned layer 408, an interlayer 410, and a reference layer 412. As further shown, the free layer 416 may include a first free layer 418, an interlayer 420, and a second free layer 422.

The seed layer 402 is a layer on which other layers of the sensing element 202 may be formed. In some implementations, the seed layer 402 provides electrical contact with a bottom electrode (not shown) of the sensing element 202. The seed layer 402 may comprise, for example, copper (Cu), tantalum (Ta), or ruthenium (Ru). In some implementations, the seed layer 402 may have a thickness in a range from approximately 15 nanometers (nm) to approximately 50 nm.

The reference system 404 is a structure designed to have a fixed direction of magnetization. As shown, the reference system 404 may be a multilayer structure that includes the antiferromagnetic layer 406, the pinned layer 408, the interlayer 410, and the reference layer 412. The antiferromagnetic layer 406 may be, for example, an iridium manganese (IrMn) layer or a platinum manganese (PtMn) layer having a thickness in a range from approximately 5 nm to approximately 30 nm. The pinned layer 408 may be, for example, a cobalt iron (CoFe) layer having a thickness in a range from approximately 1 nm to approximately 4 nm. The interlayer 410 may be, for example, a Ru layer having a thickness in a range from approximately 0.7 nm to approximately 0.8 nm. The reference layer 412 may be, for example, a CoFeB layer having a thickness in a range from approximately 1 nm to approximately 3 nm. A magnetic moment orientation of the pinned layer 408 is constrained by an effective surface magnetic field, known as an exchange bias field, which arises from the interface with the antiferromagnetic layer 406. To increase stability of the reference system 404, the pinned layer 408 is antiferromagnetically coupled to the reference layer 412 via the interlayer 410.

The tunnel barrier layer 414 is a layer designed to permit electrons to tunnel between the reference system 404 and the free layer 416 when a bias voltage is applied to electrodes of the sensing element 202 (not shown) in order to provide the TMR effect. The tunnel barrier layer 414 may be, for example, an MgO layer having a thickness in a range from approximately 0.7 nm to approximately 1.5 nm. In some implementations, a circuit component (not shown) may apply a voltage across the tunnel barrier layer 414 in association with controlling PMA of the sensing element 202 and providing offset correction, as described herein.

The free layer 416 is a structure for which a direction of magnetization changes (e.g., rotates) in response to an external magnetic field applied at the sensing element 202. As shown in FIG. 4, the free layer 416 may be a multilayer structure that may include the first free layer 418, the interlayer 420, and the second free layer 422.

In some implementations, cobalt iron boron (CoFeB) is used in the free layer 416 to increase the TMR effect at the tunnel barrier layer 414. In some implementations, the first free layer comprises CoFeB. In some implementations, the first free layer 418 has a thickness in a range from approximately 0.5 nm to approximately 2.0 nm.

In some implementations, the second free layer 422 is used in the free layer 416 to increase the PMA effect in the free layer 416. In some implementations, the second free layer 422 comprises CoFeB. In some implementations, the second free layer 422 has a thickness in a range from approximately 0.5 nm to approximately 2.0 nm.

The cap layer 424 is a layer to provide electrical contact with a top electrode of the sensing element 202 (not shown). The cap layer 424 may comprise, for example, Ta, tantalum nitride (TaN), Ru, titanium (Ti), titanium nitride (TiN), or the like. In some implementations, the cap layer 424 may have a thickness in a range from approximately 10 nm to approximately 30 nm.

As indicated above, FIG. 4 is provided as an example. Other examples may differ from what is described with regard to FIG. 4. The number, arrangement, thicknesses, and relative thicknesses, of layers shown in FIG. 4 are provided as an example. In practice, there may be additional layers, fewer layers, different layers, layers having different thicknesses, layers having different relative thicknesses, or differently arranged layers than those shown in FIG. 4. Furthermore, two or more layers shown in FIG. 4 may be implemented within a single layer, or a single layer shown in FIG. 4 may be implemented as multiple, distributed layers. Additionally, or alternatively, a set of layers (e.g., one or more layers) shown in FIG. 4 may perform one or more functions described as being performed by another set of layers shown in FIG. 4.

Figure 5:
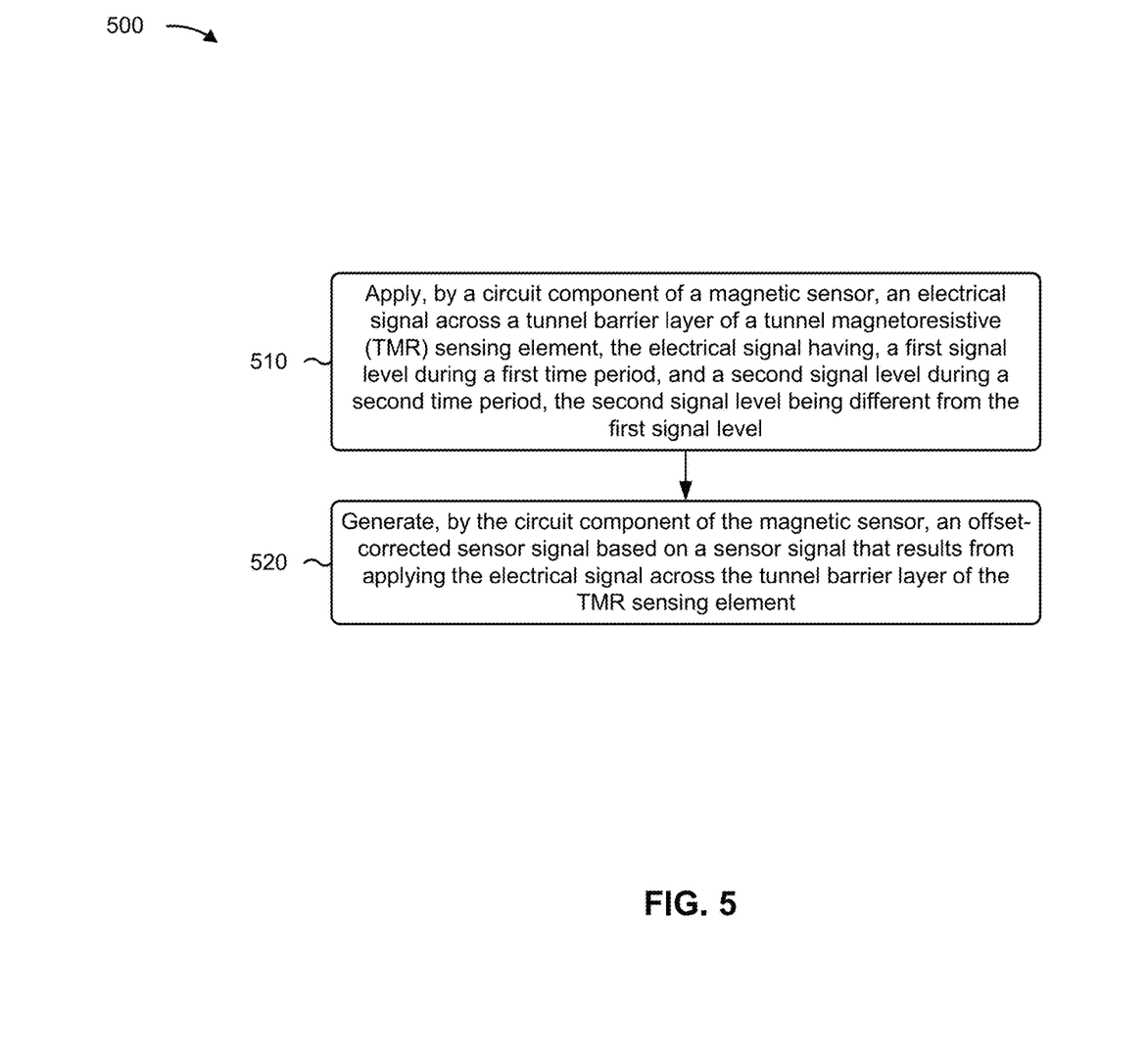
FIG. 5 is a flowchart of an example process associated with offset correction in a voltage controlled magnetic sensor.

FIG. 5 is a flowchart of an example process 500 associated with offset correction in a voltage-controlled MR sensor. In some implementations, one or more process blocks of FIG. 5 are performed by a magnetic sensor (e.g., magnetic sensor 200). In some implementations, one or more process blocks of FIG. 5 may be performed by one or more components of a magnetic sensor, such as sensing element 202, circuit component 210, ADC 320, DSP 330, memory component 340, and/or interface 350.

As shown in FIG. 5, process 500 may include applying an electrical signal across a tunnel barrier layer of a TMR sensing element, the electrical signal having a first signal level during a first time period, and a second signal level during a second time period, the second signal level being different from the first signal level (block 510). For example, the magnetic sensor (e.g., circuit component 210) may apply an electrical signal across a tunnel barrier layer of a TMR sensing element, the electrical signal having a first signal level during a first time period, and a second signal level during a second time period, the second signal level being different from the first signal level, as described above.

As further shown in FIG. 5, process 500 may include generating an offset-corrected sensor signal based on a sensor signal that results from applying the electrical signal across the tunnel barrier layer of the TMR sensing element (block 520). For example, the magnetic sensor (e.g., using the circuit component 210) may generate an offset-corrected sensor signal based on a sensor signal that results from applying the electrical signal across the tunnel barrier layer of the TMR sensing element, as described above.

Process 500 may include additional implementations, such as any single implementation or any combination of implementations described below and/or in connection with one or more other processes described elsewhere herein.

In a first implementation, the TMR sensing element is electrically connected to one or more other TMR sensing elements in a Wheatstone bridge configuration.

In a second implementation, alone or in combination with the first implementation, the electrical signal alternates between the first signal level and the second signal level over a plurality of sequential time periods.

In a third implementation, alone or in combination with one or more of the first and second implementations, a PMA of the TMR sensing element while the electrical signal is at the first signal level differs from a PMA of the TMR sensing element while the electrical signal is at the second signal level by at least approximately 5%.

In a fourth implementation, alone or in combination with one or more of the first through third implementations, the first signal level is in a range from approximately 0.1 V to approximately 1 V.

In a fifth implementation, alone or in combination with one or more of the first through fourth implementations, the second signal level is in a range from approximately −1 V to approximately −0.1 V.

In a sixth implementation, alone or in combination with one or more of the first through fifth implementations, the offset-corrected sensor signal is generated based on a difference between a signal level of the sensor signal during the first time period and a signal level of the sensor signal during the second time period.

In a seventh implementation, alone or in combination with one or more of the first through sixth implementations, the offset-corrected sensor signal corresponds to a strength of an external magnetic field at the magnetic sensor.

In an eighth implementation, alone or in combination with one or more of the first through seventh implementations, the offset-corrected sensor signal represents an amount of current creating a magnetic field at the magnetic sensor.

Although FIG. 5 shows example blocks of process 500, in some implementations, process 500 includes additional blocks, fewer blocks, different blocks, or differently arranged blocks than those depicted in FIG. 5. Additionally, or alternatively, two or more of the blocks of process 500 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, the term "component" is intended to be broadly construed as hardware, firmware, and/or a combination of hardware and software. It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A method, comprising:
applying, by a circuit component of a magnetic sensor, an electrical signal across a tunnel barrier layer of a tunnel magnetoresistive (TMR) sensing element, the electrical signal having:
a first signal level during a first time period, and
a second signal level during a second time period, the second signal level being different from the first signal level; and
generating, by the circuit component of the magnetic sensor, an offset-corrected sensor signal based on a sensor signal that results from applying the electrical signal across the tunnel barrier layer of the TMR sensing element.

2. The method of claim 1, wherein the TMR sensing element is electrically connected to one or more other TMR sensing elements in a Wheatstone bridge configuration.

3. The method of claim 1, wherein the electrical signal alternates between the first signal level and the second signal level over a plurality of sequential time periods.

4. The method of claim 1, wherein a perpendicular magnetic anisotropy (PMA) of the TMR sensing element while the electrical signal is at the first signal level differs from a PMA of the TMR sensing element while the electrical signal is at the second signal level by at least approximately 5%.

5. The method of claim 1, wherein the first signal level is in a range from approximately 0.1 volts (V) to approximately 1 V.

6. The method of claim 1, wherein the second signal level is in a range from approximately −1 volts (V) to approximately −0.1 V.

7. The method of claim 1, wherein the offset-corrected sensor signal is generated based on a difference between a signal level of the sensor signal during the first time period and a signal level of the sensor signal during the second time period.

8. The method of claim 1, wherein the offset-corrected sensor signal corresponds to a strength of an external magnetic field at the magnetic sensor.

9. The method of claim 1, wherein the offset-corrected sensor signal represents an amount of current creating a magnetic field at the magnetic sensor.

10. A magnetic sensor, comprising:
a tunnel magnetoresistive (TMR) sensing element; and
a circuit component configured to:
apply an electrical signal across a tunnel barrier layer of the TMR sensing element, the electrical signal having:
a first signal level during a first set of time periods, and
a second signal level during a second set of time periods, the second signal level being different from the first signal level;
obtain a sensor signal resulting from applying the electrical signal across the tunnel barrier layer; and
generate an offset-corrected sensor signal based on the sensor signal that results from applying the electrical signal across the tunnel barrier layer of the TMR sensing element.

11. The magnetic sensor of claim 10, wherein the TMR sensing element is electrically connected to one or more other TMR sensing elements in a Wheatstone bridge configuration.

12. The magnetic sensor of claim 10, wherein the electrical signal alternates between the first signal level and the second signal level over a plurality of time periods.

13. The magnetic sensor of claim 10, wherein a sensitivity of the TMR sensing element while the electrical signal is at the first signal level differs from a sensitivity of the TMR sensing element while the electrical signal is at the second signal level.

14. The magnetic sensor of claim 10, wherein the first signal level is a positive voltage level.

15. The magnetic sensor of claim 10, wherein the second signal level is a negative voltage level.

16. The magnetic sensor of claim 10, wherein the circuit component, to generate the offset-corrected sensor signal, is configured to generate the offset-corrected sensor signal based on a difference between a signal level of the sensor signal during the first set of time periods and a signal level of the sensor signal during the second set of time periods.

17. A sensor, comprising:
a magnetoresistive (MR) sensing element; and
one or more components configured to:
apply an electrical signal across a tunnel barrier layer of the MR sensing element during a first time period, the electrical signal having a first signal level during the first time period;
apply the electrical signal across the tunnel barrier layer of the MR sensing element during a second time period, the electrical signal having a second signal level during the second time period,
wherein the second signal level is different from the first signal level; and
generate an offset-corrected sensor signal based on a sensor signal that results from applying the electrical signal across the tunnel barrier layer of the MR sensing element during the first time period and the second time period.

18. The sensor of claim 17, wherein the MR sensing element is electrically connected to one or more other MR sensing elements in a Wheatstone bridge configuration.

19. The sensor of claim 17, wherein a sensitivity of the MR sensing element while the electrical signal is at the first signal level differs from a sensitivity of the MR sensing element while the electrical signal is at the second signal level.

20. The sensor of claim 17, wherein the one or more components, to generate the offset-corrected sensor signal, are configured to generate the offset-corrected sensor signal based on a difference between a signal level of the sensor signal during the first time period and a signal level of the sensor signal during the second time period.

* * * * *